(12) United States Patent
Hauser et al.

(10) Patent No.: US 9,620,391 B2
(45) Date of Patent: Apr. 11, 2017

(54) ELECTRONIC COMPONENT WITH A LEADFRAME

(71) Applicant: Micronas GmbH, Freiburg (DE)

(72) Inventors: Wolfgang Hauser, Endingen (DE); Viktor Heitzler, Umkirch (DE); Christian Joos, Ehrenkirchen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 14/880,072

(22) Filed: Oct. 9, 2015

(65) Prior Publication Data

US 2016/0035594 A1    Feb. 4, 2016

Related U.S. Application Data

(63) Continuation of application No. 10/685,308, filed on Oct. 14, 2003, now abandoned.

(Continued)

(30) Foreign Application Priority Data

Oct. 11, 2002 (DE) .................................. 102 47 610

(51) Int. Cl.
*H01L 21/00* (2006.01)
*H01L 21/56* (2006.01)
(Continued)

(52) U.S. Cl.
CPC ...... *H01L 21/565* (2013.01); *H01L 23/49541* (2013.01); *H01L 23/49562* (2013.01); *H01L 24/49* (2013.01); *H01L 24/48* (2013.01); *H01L 2224/48091* (2013.01); *H01L 2224/48247* (2013.01); *H01L 2224/48257* (2013.01); *H01L 2224/49175* (2013.01); *H01L 2224/49433* (2013.01); *H01L 2924/00014* (2013.01); *H01L 2924/0103* (2013.01); *H01L 2924/0105* (2013.01); *H01L 2924/01033* (2013.01);
(Continued)

(58) Field of Classification Search
CPC .. H01L 21/565; H01L 23/49541; H01L 24/49
See application file for complete search history.

(56) References Cited

U.S. PATENT DOCUMENTS 3,762,039 A    10/1973 Douglass et al.
4,012,765 A    3/1977 Lehner et al.
(Continued)

FOREIGN PATENT DOCUMENTS

DE    691 13 079 T2    2/1991
EP    0 548 496 A1    6/1993
(Continued)

*Primary Examiner* — Laura Menz
(74) *Attorney, Agent, or Firm* — Muncy, Geissler, Olds & Lowe, P.C.

(57) ABSTRACT

The invention relates to an electronic component including a leadframe, composed of a platform, and possibly at least one electrical connecting piece, wherein at least one electronic member is located on the platform, and including a housing that encloses the electronic member and the platform, wherein at least one support region is provided to support the platform during the fabrication process for the housing, and wherein at least a section of the at least one support region projects from the housing.

4 Claims, 3 Drawing Sheets

Related U.S. Application Data

(60) Provisional application No. 60/418,512, filed on Oct. 15, 2002.

(51) Int. Cl.
*H01L 23/495* (2006.01)
*H01L 23/00* (2006.01)

(52) U.S. Cl.
CPC ............... *H01L 2924/01082* (2013.01); *H01L 2924/181* (2013.01); *H01L 2924/1815* (2013.01)

(56) References Cited

U.S. PATENT DOCUMENTS

| | | |
|---|---|---|
| 4,113,474 A | 9/1978 | Okano et al. |
| 4,451,973 A | 6/1984 | Tateno et al. |
| 4,663,833 A | 5/1987 | Tanaka et al. |
| 4,855,807 A | 8/1989 | Yamaji et al. |
| 4,954,307 A | 9/1990 | Yokoyama |
| 5,049,526 A | 9/1991 | McShane et al. |
| 5,113,240 A | 5/1992 | Bozzini et al. |
| 5,247,202 A | 9/1993 | Popovic et al. |
| 5,252,944 A | 10/1993 | Caddock et al. |
| 5,291,178 A | 3/1994 | Strief et al. |
| 5,294,829 A | 3/1994 | Hundt et al. |
| 5,337,216 A | 8/1994 | McIver |
| 5,427,938 A | 6/1995 | Matsumura et al. |
| 5,458,158 A * | 10/1995 | Kawanabe ............. B21F 11/00 140/105 |
| 5,498,902 A | 3/1996 | Hara |
| 5,570,273 A | 10/1996 | Siegel et al. |
| 5,578,817 A | 11/1996 | Bidiville et al. |
| 5,610,800 A | 3/1997 | Hundt et al. |
| 5,623,162 A | 4/1997 | Kurihara |
| 5,841,187 A | 11/1998 | Sugimoto et al. |
| 6,043,111 A | 3/2000 | Furuse |
| 6,150,715 A | 11/2000 | Ichikawa et al. |
| 6,197,615 B1 | 3/2001 | Song et al. |
| 6,203,931 B1 | 3/2001 | Chu et al. |
| 6,255,722 B1 | 7/2001 | Ewer et al. |
| 6,258,624 B1 | 7/2001 | Corisis |
| 6,262,480 B1 | 7/2001 | Ferri et al. |
| D466,485 S | 12/2002 | Maehara et al. |
| 6,498,394 B1 | 12/2002 | Fehr |
| 6,521,358 B1 | 2/2003 | Tanaka et al. |
| 6,639,306 B2 | 10/2003 | Huang |
| 6,664,647 B2 | 12/2003 | Kasuga et al. |
| 6,684,496 B2 | 2/2004 | Glenn |
| 6,927,482 B1 | 8/2005 | Kim et al. |
| 2001/0010949 A1 * | 8/2001 | Miyaki ................ H01L 21/565 438/123 |
| 2001/0033011 A1 | 10/2001 | Huang |
| 2002/0033523 A1 | 3/2002 | Cigada et al. |
| 2002/0041911 A1 | 4/2002 | Mine |
| 2002/0048846 A1 | 4/2002 | Corisis |
| 2002/0121680 A1 | 9/2002 | Ahn et al. |

FOREIGN PATENT DOCUMENTS

| | | |
|---|---|---|
| EP | 0 454 440 A1 | 5/1996 |
| GB | 2151845 A | 7/1985 |
| JP | S 55-067146 A | 5/1980 |
| JP | S 58-154252 A | 9/1983 |
| JP | S 61-032434 A | 2/1986 |
| JP | 61095536 A * | 5/1986 |
| JP | S 61-095536 A | 5/1986 |
| JP | S 61-140157 A | 6/1986 |
| JP | S 61-144852 A | 7/1986 |
| JP | H 02-33957 A | 7/1988 |
| JP | S 63-187656 A | 8/1988 |
| JP | H 01-099245 A | 4/1989 |
| JP | H 01-158756 A | 6/1989 |
| JP | H 01-196153 A | 8/1989 |
| JP | H 02-177710 A | 7/1990 |
| JP | H 03-058452 A | 3/1991 |
| JP | H 03-132046 A | 6/1991 |
| JP | H 05-047979 A | 2/1993 |
| JP | H 05-095056 A | 4/1993 |
| JP | H 05-183082 A | 7/1993 |
| JP | 2002-040058 A | 2/2002 |

* cited by examiner

ELECTRONIC COMPONENT WITH A LEADFRAME

This nonprovisional application is a continuation application of U.S. application Ser. No. 10/685,308, which was filed on Oct. 14, 2003 and which claims priority to German Patent Application No. DE 102 47 610, which was filed in Germany on Oct. 11, 2002, and to U.S. Provisional Application No. 60/418,512, which was filed on Oct. 15, 2002, and which are all herein incorporated by reference.

BACKGROUND OF THE INVENTION

The present invention relates to the field of semiconductors, and in particular to semiconductor packaging.

In general, an electronic component includes a leadframe composed of at least one platform and possibly at least one electronic connector, at least one electronic member, and a housing. The at least one electronic member here is located on the platform. In addition, the electronic member and platform are generally completely enclosed by the housing.

The housing of the electronic component is generally fabricated by a molding process, the so-called molding procedure. In the molding procedure, the part of the leadframe to be molded, specifically, the platform, together with the electronic member disposed on the platform, projects unprotected into the cavity of the mold, the so-called molding die. During molding, the molding compound is introduced under high injection pressures into the cavity of the mold. In addition, a nonuniform distribution of pressure exerted by the molding compound is present in the cavity during the molding procedure. The result is that the section of the leadframe projecting into the cavity may be bent during molding. The consequence of this is that the electrical and magnetic properties of the electronic member may be altered in an undesirable manner. For example, the sensitivity of a Hall sensor may be degraded by the tilting of the platform on which the sensor element is located.

Therefore, there is a need for an electronic component, or a method for fabricating an electronic component, in which the above-described tilting risk for the leadframe is prevented.

SUMMARY OF THE INVENTION

An electronic component includes a leadframe, composed of a platform and preferably at least one electrical connecting piece. The electronic component has at least one electronic member which is located on the platform. The electronic component also includes a housing that encloses the electronic member and the platform. In the electronic component, there is at least one support region on the platform to support the platform during the fabrication process creating the housing, and at least a section of the at least one support region projecting from the housing of the electronic component.

The region of the leadframe (i.e., the platform projecting exposed into the cavity of the molding die during the molding procedure) is supported by a molding die. As a result, molding compound is not accumulated during the molding procedure in the section of the support region supported by the molding die—with the result that at least a section of the support region projects from the housing.

In one embodiment, at least one support region is designed as a lobe element molded onto the platform. In another embodiment, the at least one lobe element is molded onto the platform forming a single piece, allowing the platform and lobe element to be inexpensively fabricated as a stamped piece.

Since at least a section of the lobe element or support region projects from the housing, at least a section of the lobe element or support region is directly exposed to ambient moisture. In order to prevent any penetration of ambient moisture into the housing in the transition zone between the platform and the lobe element or support region, and thus into the housing, a notch-like depression is provided along the transition zone.

In another preferred embodiment, the at least one connecting piece is molded onto the platform forming a single piece, thereby forming the connecting piece and platform as one integrated unit. Here at least a section of the connecting piece is guided outside the housing. As a result, during the molding procedure the leadframe may receive additional support by the connecting piece.

The electronic component may include three or more connecting pieces that run parallel and on one side of the housing. A embodiment of this design is, for example, a Hall sensor.

A thin anticorrosive film may extend over at least a section of the lobe element. For example, the support region may be covered by a thin film of the housing plastic. The thin film may, for example, be created during fabrication of the housing by generating a small cavity between the support region and the mold, the cavity being filled by the plastic when the plastic is injected.

The leadframe may be fabricated by a metal or metal alloy. At least a section of the surface of the leadframe may be coated, and in particular, coated with an alloy containing tin or tin-lead.

During molding the support region of the leadframe projecting into the cavity of the mold, that is, at least one region of the platform, is supported by the mold. At least one pin-like element be provided in the upper and lower shell of the mold, with the result that the support region is jammed between the pin elements of the upper and lower shells of the mold during the molding procedure. The pin elements may be configured as integral components of the sidewall of the mold shells, of the molding die, or mold.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
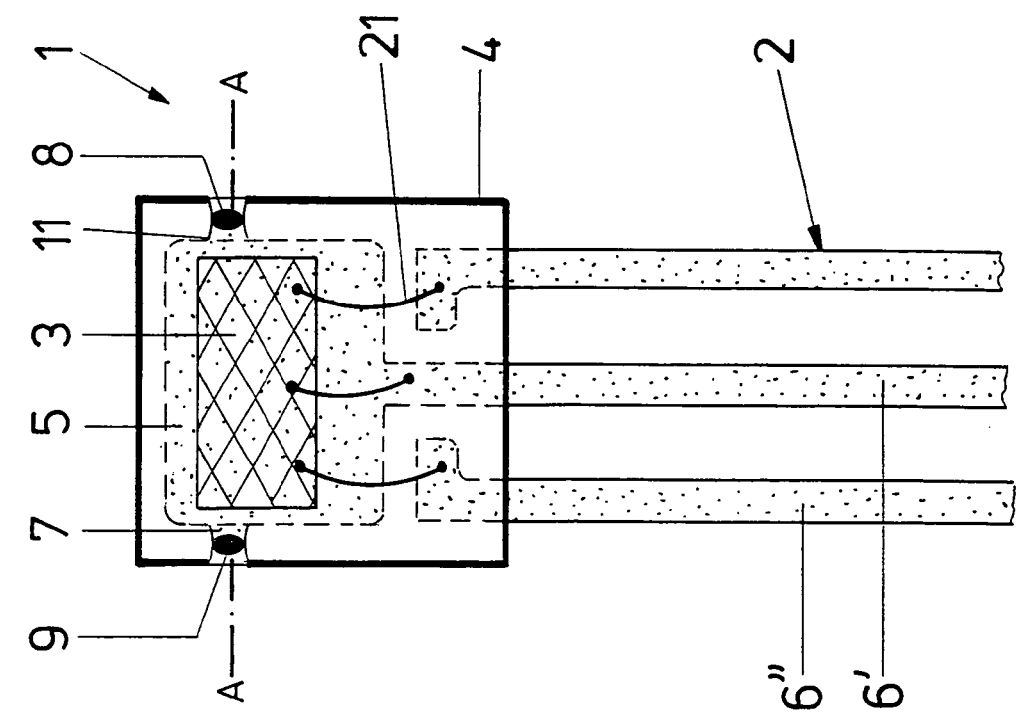
FIG. 1 is a schematic drawing of a top view an electronic component.

FIG. 1 is a top view of an electronic component 1 that includes a leadframe 2, an electronic member 3 and a housing 4. The electronic component 1 includes a leadframe made of a metal alloy. The housing 4 is made of a plastic such as epoxy resin. In this example, the electronic member 3 of electronic component 1 is configured as a Hall sensor.

The leadframe 2 includes a platform 5 and three parallel connecting pieces 6', 6". In this example, the connecting piece 6' is molded onto the platform 5 as one piece. Connecting pieces 6" project into the housing 4 of the electronic component 1, without directly contacting platform 5. The electronic member 3 is located on the platform 5. Electronic contact between the electronic member 3 and the connecting pieces 6' and 6" is provided by bonds 21 within the housing 4. The electrical connection of the electronic member 3 to the region outside the housing 4 is provided by the connecting pieces 6' and 6". Additionally, two opposing lobe elements 7 are molded onto the platform 5, forming one piece. The housing 4 has holes 8 in the region of each lobe element 7, the holes being identified as support holes. The section 9 shown dark in FIG. 1 represents the overlap zone between each lobe element 7 and each support hole 9, that is, each lobe element 7 in overlap zone 9 projects beyond housing 4. Also provided in the transitional zone between the platform 5 and the lobe element 7 is one notch-shaped depression 10, which prevent ambient moisture in the region of support holes 8 from penetrating into the housing 4.

Figure 2:
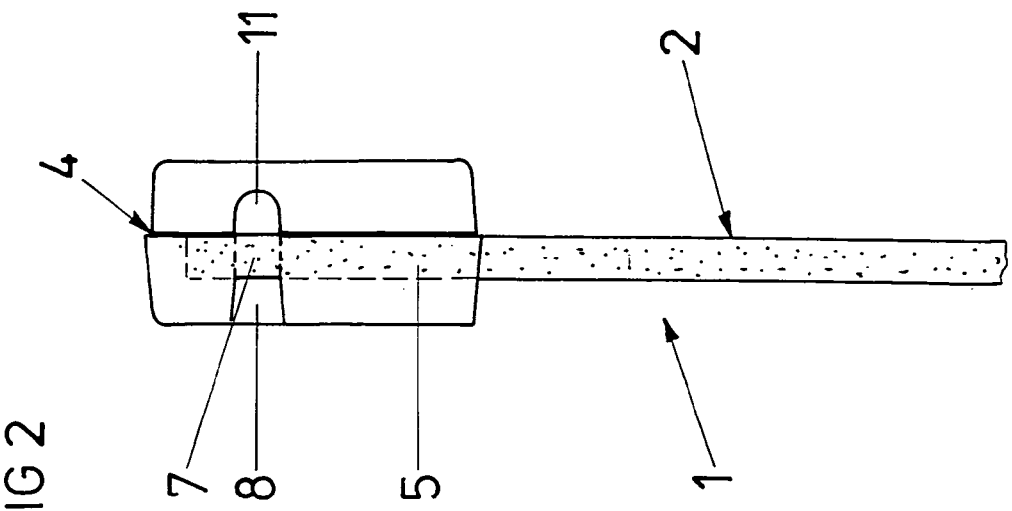
FIG. 2 is a side view of the electronic component.

FIG. 2 is a side view of the electronic component 1 described in FIG. 1, where within the housing 4 only the platform 5 and lobe element 7 are shown. The support hole 11 located on the bottom side of housing 4. The support hole 11 is located opposite support hole 8. The effect of the support hole 11 is that a section of the bottom side of the lobe element 7 projects from the housing 4. The effect of the support hole 8 is that, as already described in FIG. 1, the top side of the lobe element 7 projects from the housing 4. The platform 5 is supported by the lobe element 7 on both sides against mold 12 (shown in FIG. 4) in the region of support holes 8 and 11, thereby preventing tipping of the platform 5 during the molding procedure.

Figure 3:
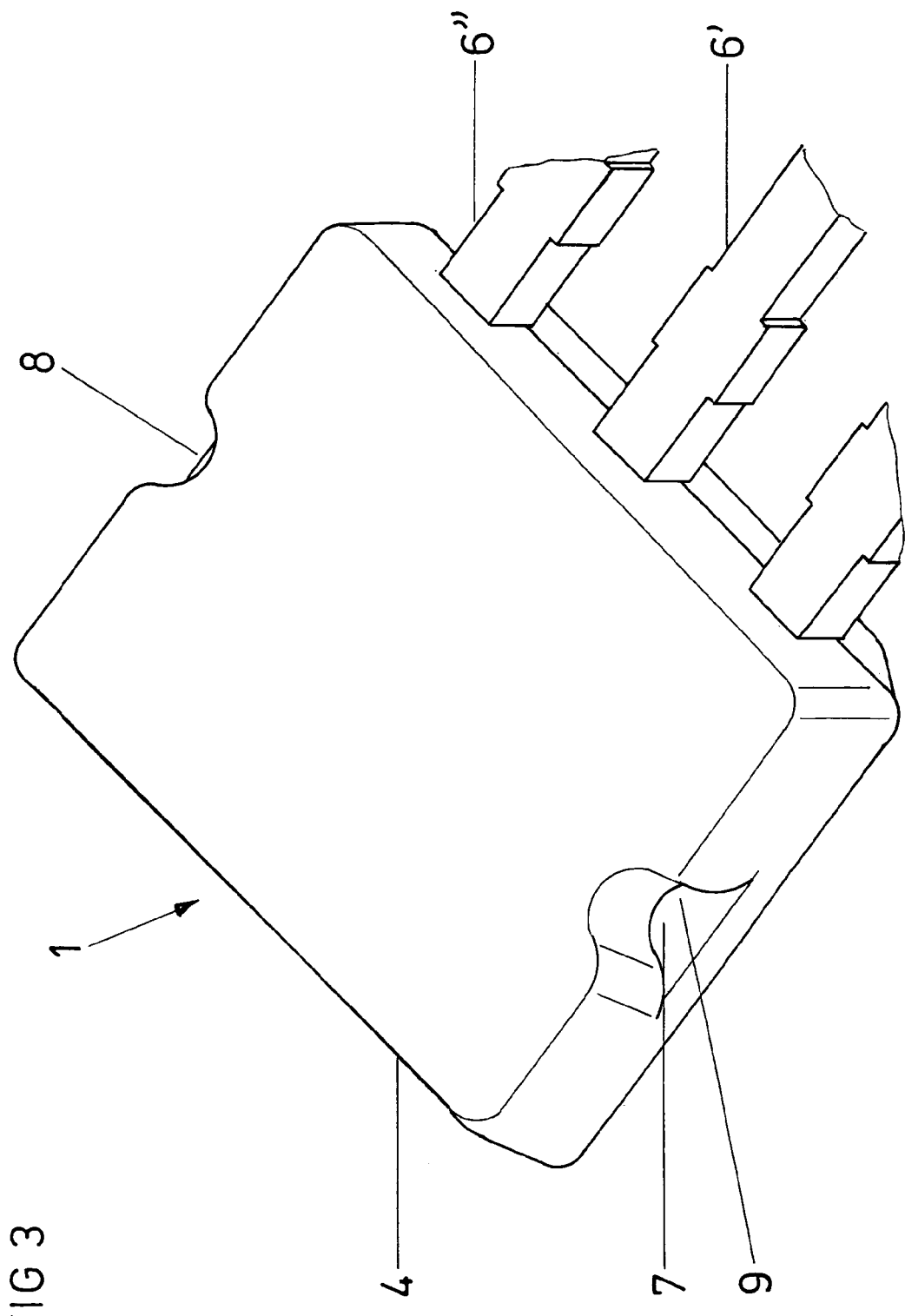
FIG. 3 is a perspective view of the electronic component.
Figure 4:
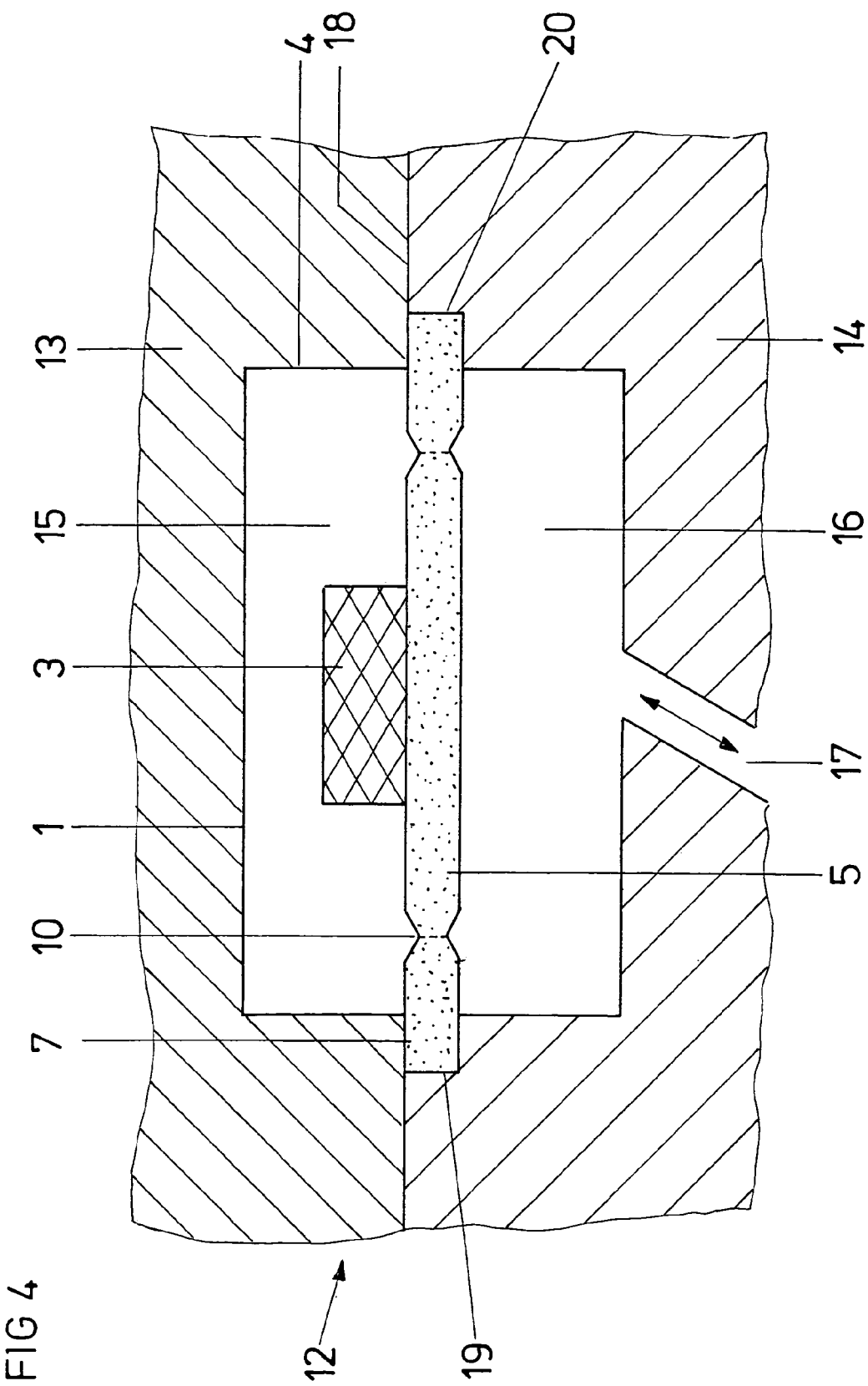
FIG. 4 shows the electronic component during fabrication of the housing in a sectional view along A-A in FIG. 1.

FIG. 3 is a perspective view the providing a clearer understanding of electronic component 1. FIG. 4 shows electronic component 1 during fabrication of housing 4 in a sectional view along axis A-A in FIG. 1. Molding die 12 is clearly recognizable, composed of an upper mold shell 13 and a lower mold shell 14. During the molding procedure, mold shells 13 and 14 are brought into contact along parting plane 18 such that a closed cavity is formed by molding die 12, composed of cavity halves 15 and 16. A channel 17 to fill cavity halves 15 and 16 with the molding compound is shown, simply as an example, in lower mold shell 14. It is also evident that opposing lobe elements 7 molded on forming a single piece with platform 5 are supported in the region of parting plane 18 by upper mold shell 13 and lower mold shell 14. Recesses 19 are provided in upper mold shell 13, and recesses 20 are provided in lower mold shell 14 to accommodate each lobe element 7, with recesses 19 and 20 forming a matching space for each accommodated lobe element 7 in the state in which mold shells 13 and 14 are pressed together.

Although the present invention has been shown and described with respect to several preferred embodiments thereof, various changes, omissions and additions to the form and detail thereof, may be made therein, without departing from the spirit and scope of the invention.

What is claimed is:

1. A method for producing an electronic component, the method comprising:
   providing a lead frame and a platform on which the electronic component is arranged;
   integrally forming two oppositely arranged lobe elements at sides of the platform, wherein the lobe elements are arranged on a same plane as the platform;
   placing the platform and at least a portion of the lead frame in a mold;
   producing, by an encapsulating molding process via the mold, a housing which surrounds the electronic component and the platform;
   supporting the platform via the lobe elements at both sides relative to the mold during the encapsulating molding process so that no encapsulating molding material is deposited in the section of the lobe elements,
   wherein the lobe elements protrude at least in section out of the housing and the housing has in a region of each of the lobe elements two mutually opposite support holes,
   wherein the lobe elements only partly cover the support holes so that the lobe elements do not protrude beyond the external dimensions of the housing,
   wherein the platform is separately fixed and injection-molded around, and
   wherein the platform is not part of a lead frame.

2. The method according to claim 1, wherein the leadframe is fabricated out of a metal or a metal alloy.

3. The method according to claim 1, further comprising providing a thin anticorrosive film along at least a section of the lobe elements.

4. The method according to claim 1, further comprising providing a notch-like depression between the platform and the lobe element.

* * * * *